(12) United States Patent
Khoche et al.

(10) Patent No.: US 7,712,000 B2
(45) Date of Patent: May 4, 2010

(54) ATE ARCHITECTURE AND METHOD FOR DFT ORIENTED TESTING

(75) Inventors: Ajay Khoche, San Jose, CA (US); Klaus-Dieter Hilliges, Shanghai (CN)

(73) Assignee: Verigy (Singapore) Pte. Ltd., Singapore (SG)

( * ) Notice: Subject to any disclaimer, the term of this patent is extended or adjusted under 35 U.S.C. 154(b) by 686 days.

(21) Appl. No.: 11/589,465

(22) Filed: Oct. 30, 2006

(65) Prior Publication Data

US 2008/0104461 A1 May 1, 2008

(51) Int. Cl.
*G01R 31/28* (2006.01)
(52) U.S. Cl. ................................................ 714/725
(58) Field of Classification Search ................ 714/724
See application file for complete search history.

(56) References Cited

U.S. PATENT DOCUMENTS

| | | | |
|---|---|---|---|
| 6,462,532 B1 * | 10/2002 | Smith | 324/158.1 |
| 6,557,128 B1 * | 4/2003 | Turnquist | 714/724 |
| 6,966,018 B2 * | 11/2005 | Hilliges | 714/724 |
| 6,990,423 B2 * | 1/2006 | Brown et al. | 702/117 |
| 7,102,375 B2 * | 9/2006 | Walker et al. | 324/761 |
| 7,366,967 B2 * | 4/2008 | Jeon et al. | 714/724 |
| 2005/0289415 A1 * | 12/2005 | Dean et al. | 714/724 |

* cited by examiner

*Primary Examiner*—James C Kerveros
(74) *Attorney, Agent, or Firm*—Holland & Hart, LLP (57) ABSTRACT

An ATE system is described for testing one or more DFT testing blocks contained in one or more DUTs when coupled to the ATE system. The ATE system includes hardware resources and software processes under the control of a DPK (Distributed Processing Kernel). The DPK couples the hardware resources and software processes as needed for a first DFT testing block to be enabled for testing only when such resources and processes are available and locked for the first DFT testing block. The DPK is coupled to the first DFT testing blocks via data channels and control channels that are selected as needed for having the first DFT testing block enabled for testing. The channels are under the control of an DUTs-ATE interface which is directed by the DPK for connecting the first DFT testing block to the locked hardware resource and the locked software processes. Each set up process corresponding to any subsequent DFT testing block requesting any hardware resource and any software processes that are already locked for use is paused until such locked resource and locked software processes are unlocked and assigned for having that subsequent DFT testing block enabled for testing.

14 Claims, 5 Drawing Sheets

ATE ARCHITECTURE AND METHOD FOR DFT ORIENTED TESTING

BACKGROUND OF THE INVENTION

The present invention relates to testing of Integrated Circuits (ICs) and semiconductor devices by Automated Test Equipment (ATE).

During typical semiconductor manufacturing processes, ICs are tested to assure proper operation. The ATEs perform the necessary tests to ensure the quality, with ICs being the Device Under Test (DUT). Complex ICs these days are typically tested with the help of on-chip DFT (Designed for Test) including BIST (Built In Self Test) as well as some Built off Self Test structures (all hereinafter known as DFT structures) in conjunction with readily available ATE. Those DFT structures include various testing blocks for performing prescribed test processes. Devices with DFT structures can be classified into three categories:

1. Fully autonomous where the DUT just needs one or more power supplies and one or more clocks to have the testing enabled and subsequent data captured without further attention of the tester (operator) and/or the ATE.
2. Semi-autonomous where the DUT may need initial set up to start the test and may need subsequent attention of the tester (operator) and/or the ATE to receive the testing results. There may also be other intermediate actions arising from prescribed activity and requiring attention before testing is fully completed.
3. Non-autonomous, where the DUT needs constant attention of the tester (operator) and/or the ATE at regular intervals in order for the testing to be enabled, completed and the generated data captured.

In the currently known ATE architectures used in the test and measurement industry, test channels and needed ATE hardware and software are dedicated to the testing block under test for the entire test session of the block test via device pins. The resource allocation is defined before the test program is executed. The ATE software is designed to allow this kind of allocation of the test channels to the block via the device pins. As will be explained subsequently, this kind of ATE architecture leads to inefficient testing of DFT-oriented devices in terms: of lower ATE resource utilization, need for higher number of ATE resources, limiting efficient data collection, and inability to test certain types of devices concurrently with other devices.

The ever increasing pressure to reduce test cost demands reduction in the cost associated with ATE, which makes a significant portion of the overall test cost. The conventional ATE architectures are functionally capable of performing the necessary tests, however, their efficiency for testing DFT oriented devices is low as mentioned above. As will be explained, there are disadvantages for having the ATE resources constantly tied to the testing block under test until the testing block finishes its tests. The ATE resources include ATE hardware, ATE channels, ATE software for monitoring and/or controlling channel activity and for having prescribed test processes conducted and all other associated equipment and circuitry for having testing blocks operated for testing. In conventional ATE systems, the ATE resources are set up to have access via ATE data and ATE control channels to the ATE hardware and ATE software resources needed for monitoring and conducting all the testing activities for each testing block in the DUT, during the entire test session for that block.

Figure 1:
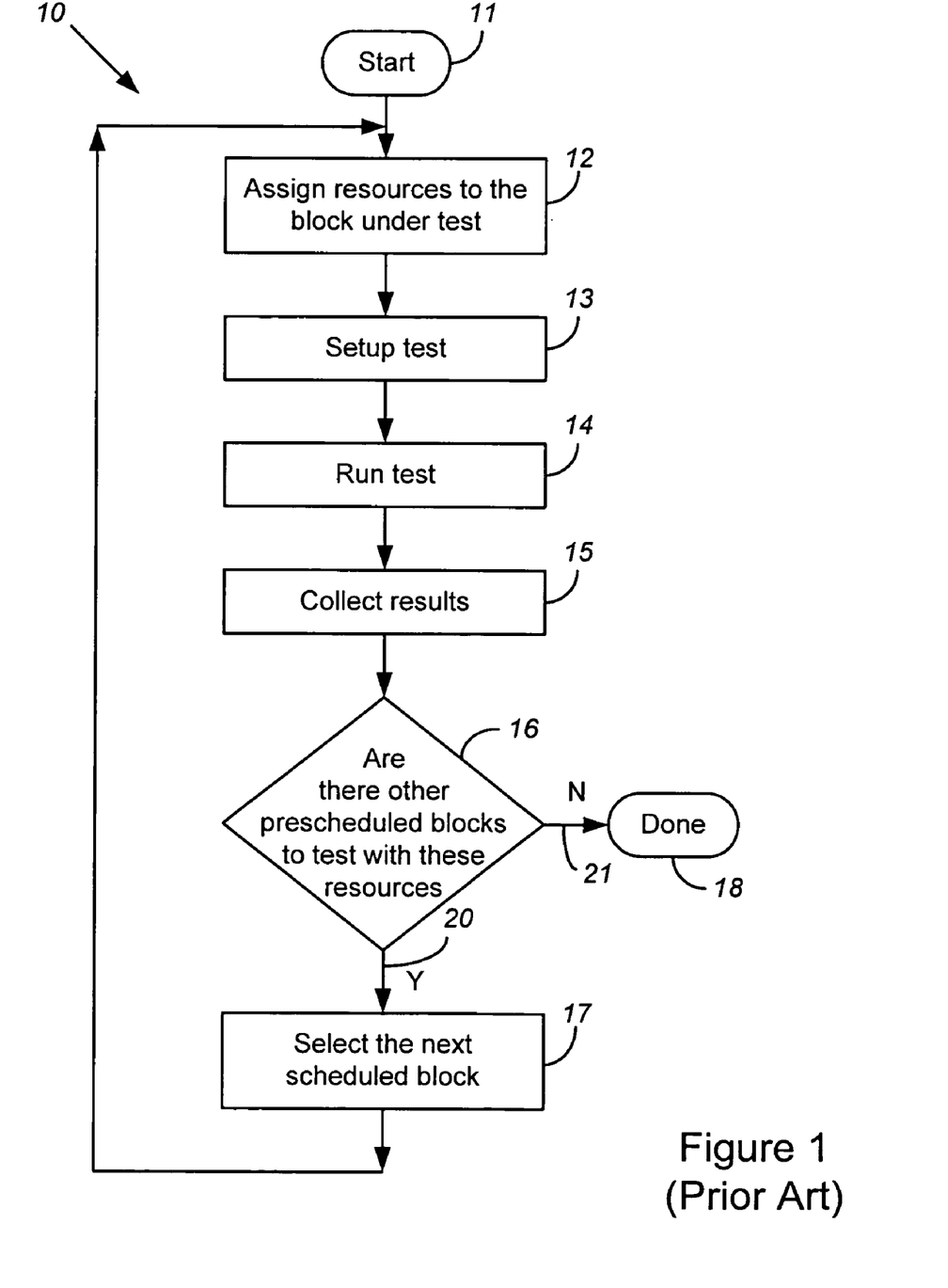
FIG. 1 is a test flow diagram for a prior art ATE system.

FIG. 1 depicts a conventional test flow diagram 10 of activity blocks and steps for a conventional ATE system well known in the prior art for having a DUT enabled for testing.

In conventional ATE systems, all of the testing blocks are prescheduled for testing. Briefly described, the ATE system begins at a Block 11 (marked with START) and moves to a Block 12 where set up is arranged (automatically, by an operator or a combination of both) for a first selected testing block. The ATE resources needed for that first selected testing block are assigned. The ATE system then moves to a Block 13 where the entire set up for having the selected testing block enabled for testing is arranged using the assigned ATE resources. The ATE system then moves to a Block 14 where the actual test is conducted for the testing block. The test results are subsequently collected (i.e., captured) as part of the activities in a Block 15. In some cases, e.g., scan test, the results collection can happen simultaneously with the stimulus application. Subsequently, the ATE system moves to a decision Block 16, where a check is made to determine if another prescheduled testing block is to be enabled for testing. If there is another prescheduled testing block, the ATE system moves along a path 20 (marked with a Y meaning Yes) to a Block 17 where that next scheduled testing block is selected. The ATE system then moves to the Block 12 and continues through the subsequent blocks as was done for the first selected testing block. This process is reiterated until all the testing activity for all the testing blocks have been completed which results in the ATE system moving along a path 21 (marked N meaning No) from the decision Block 16 to a Block 18 (marked DONE) where the ATE system stops its testing activities. In the conventional ATEs, the sequence in which the blocks are selected for testing with a set of associated resources is decided before the test execution begins.

Figure 2:
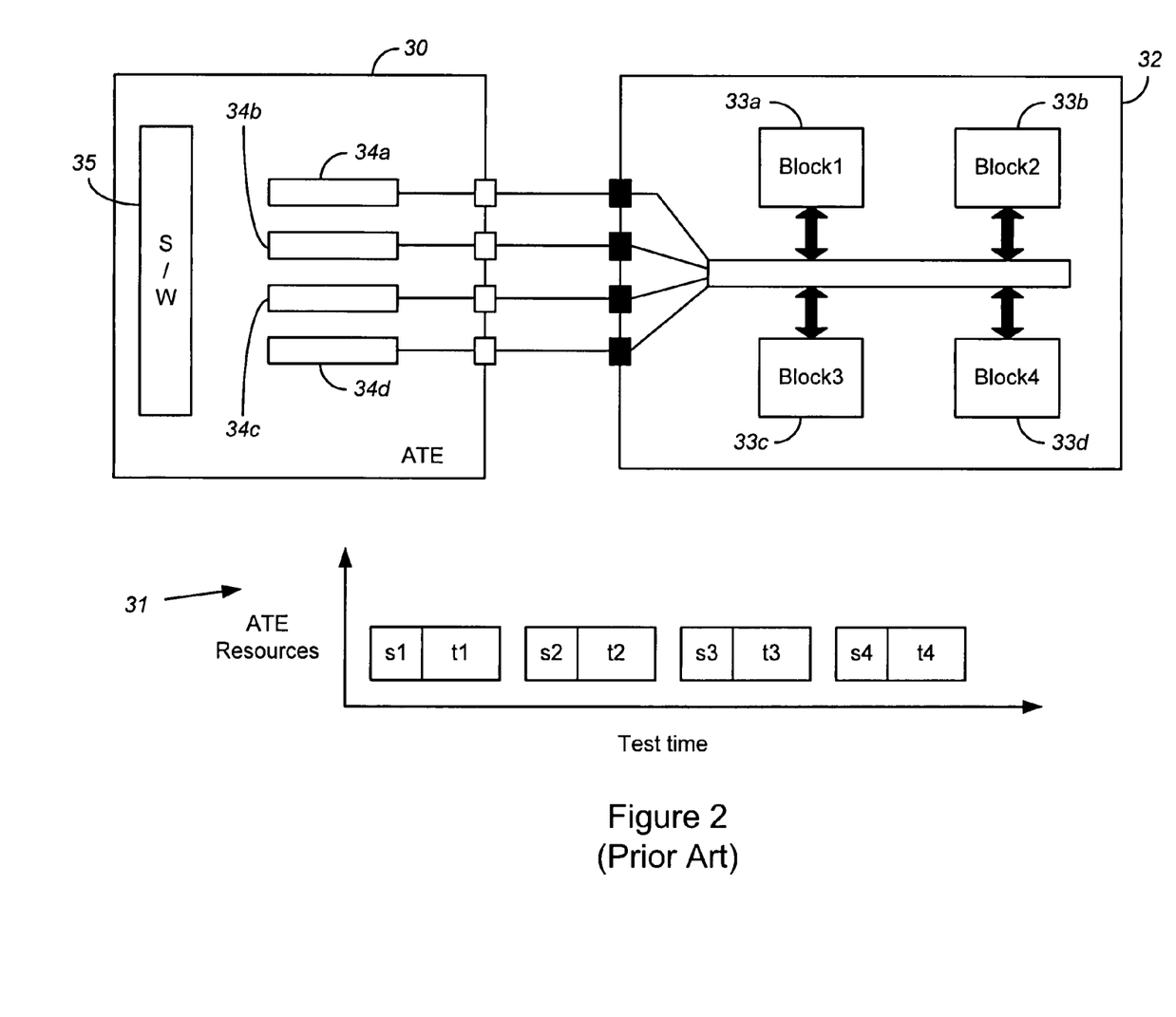
FIG. 2 is a block diagram of a prior art ATE system and a graph depicting a corresponding time impact.

FIG. 2 shows a block diagram of an exemplary and more detailed ATE system 30 known in the prior art and a graph 31 that depicts the corresponding test time impact. For ease of understanding and not for limitation, the ATE system 30 for this description is described with specifically limited features. The ATE system 30 is coupled to a DUT 32 which has four testing Blocks 33a-33d each having autonomous DFT structures that allow parallel testing of these blocks with each testing block running independently after set up. The DUT 32 can be a single IC die being tested or one die on a wafer containing many dice each containing DFT structures. For this description all the test Blocks 33a-33d require the same ATE hardware resources 34a-34d and applicable software resources 35 so that the ATE system 30 operates in accordance with the test flow diagram 10 shown in FIG. 1 for having each of the test Blocks 33a-33d enabled for testing.

If the testing is done one testing block at a time using conventional architectures, the total test time is:

Total test time=$s1+t1+r1+s2+t2+r2+s3+t3+r3+s4+t4+r4$

Where each # references the corresponding numbered testing block, the test set up time is s# for that testing block, the test time is t# for that testing block, and the time to read results is r# for that testing block.

In contrast, if each testing block was allowed to run in parallel after set up the total test times can be reduced to:

Total test time=$s1+s2+s3+s4+\max(t1,t2,t3,t4)+r1+r2+r3+r4$

In this case setup and results collection are still sequential due to shared access to the block from the pins. However, after the setup the autonomous blocks can run the tests in parallel.

The parallel concept also applies to the multi-site case where, for example, each die (having one or more testing blocks) on a semiconductor wafer may not need the attention of the ATE system 30 all the time. However, for the conventional ATE architectures, the multi-site case still needs replication of ATE hardware and software resources (which increases the overall cost) even if the attention of the ATE system 30 is needed only a fraction of the total test time. Whereas in the present invention this is not the case, so long as the infrastructure exits to connect ATE resources dynamically to different blocks and/or dice during the test flow.

It is known in the prior art to make an infrastructure for connecting ATE hardware and software resources dynamically to multiple dies at different instances of time via associated data and control channels. So it is generally desirable to test a number of dice in parallel. Testing techniques have been proposed that enable parallel testing of multiple dice of a wafer with a single probe. Examples of such parallel schemes include those described in U.S. Pat. No. 6,426,904, entitled "Structures for Wafer Level Test and Burn-In" to Barth, et al, U.S. Pat. No. 6,275,051, entitled "Segmented Architecture for Wafer Test and Burn-In" to Bachelder, et al, U.S. Pat. No. 6,134,685, entitled "Package Parallel Test Method and Apparatus" to Spano, and U.S. Pat. No. 5,896,040, entitled "Configurable Probe Pads to Facilitate Parallel Testing of Integrated Circuit Devices" to Brannigan, et al.

However, in the above disclosures, the DUTs must be analyzed to determine a priori to identify which blocks may be tested in parallel since there may be blocks that are not suitable for parallel testing due to either device or ATE constraints. For example, even though the digital test blocks can be tested in parallel, if there are analog test blocks (such as for testing for radio frequency mutual interference), then those test blocks must be tested serially if analog resources are scarce. In addition, the conventional ATEs also require the resources to remain allocated to the block under test for the entire duration of the test of that block. As a result, the conventional architectures do not exploit the autonomous nature of DFT blocks to leverage the full potential of parallel testing.

SUMMARY OF THE INVENTION

The present invention overcomes the problems described in the prior section. In accordance with the teachings of the present invention, an ATE system is made such that ATE resources are allocated to the testing block under test (i.e., in the DUT) only when the testing block needs ATE attention and allows the channels to cater to needs of other blocks otherwise. In the present invention the ATE resources are available in a common pool and assigned to devices under test when needed. This arrangement allows distributed processing of the test flows.

DETAILED DESCRIPTION

Figure 3:
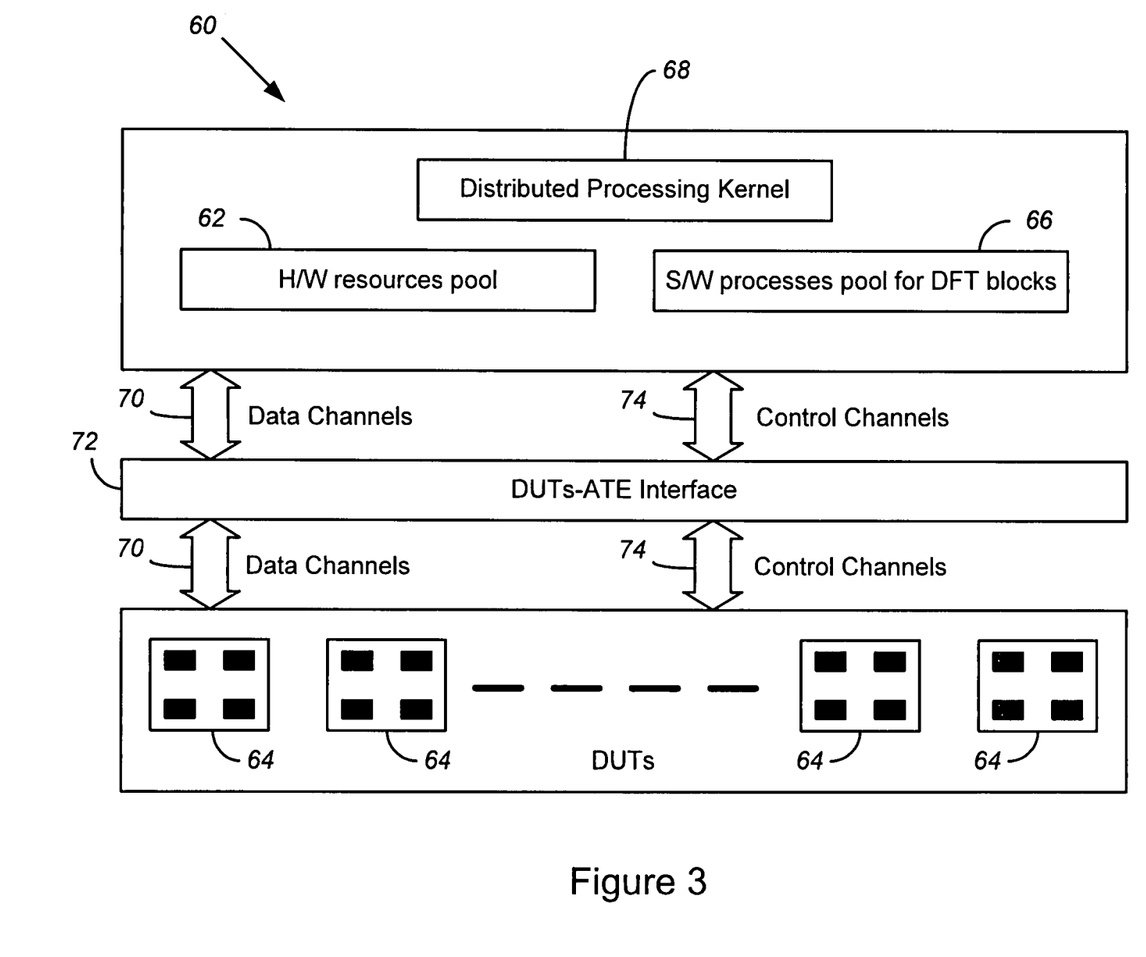
FIG. 3 depicts a DFT centric test cell architecture made in accordance with the teachings of the present invention.

FIG. 3 depicts a DFT centric test cell architecture made in accordance the teachings of the present invention. In a preferred embodiment 60 of the present invention, a hardware (H/W) resources Pool 62 includes of all the ATE hardware (not shown) that are necessary to enable and perform the testing of a plurality of DUTs 64 each containing four (4) DFT blocks (generally depicted as solid rectangles). Each DFT block, by way of example and not limitation, can be a digital block, a memory or an Analog or RF block. Additionally, as will be described in greater detail, the hardware resources Pool 62 has other resources for flexible and dynamic assignment of elements of the H/W resources Pool 62 to various ATE channels and for providing support to handle events, interrupts, protocols, etc., in view of any predetermined stimulus and/or expected data. A software (S/W) processes Pool 66 for DFT blocks includes a dynamic pool of conventionally known software test processes (not shown) created to handle the testing of any DFT block in the DUTs 64. Each software process exists for having one or more DFT blocks operated for testing as appropriate. All the software test processes are arranged, as is known in the prior art for distributed operating systems without undue experimentation, to acquire dynamically any of the ATE hardware in the H/W resources Pool 62 as required for having a specific DFT block operated under a predetermined testing process and to relinquish any of them when the need for the resources by the process is over. A distributed Processing Kernel 68 includes prescribed hardware and software operating as necessary to set up and have DFT blocks operated for testing, to allocate ATE hardware in the H/W resources Pool 62 to software test processes in the S/W processes Pool 66 and to handle events that arise when the DFT blocks are operated for testing. The Distributed Processing Kernel 68 routes each of the events from ATE hardware to the DUT and vice-versa as required to process the event during the testing of a specific DUT. It also arranges for secure paths for various respective software test processes to connect to the applicable ATE hardware. The Distributed Processing Kernel 68 further manages the allocation of ATE hardware and software resources for optimal test scheduling.

The embodiment 60 further includes conventional Data Channels 70 that are preferably made secure from being adversely affected by conditions and events not arising from the actual testing of the DFT blocks. The Data Channels 70 are used for transferring data to and from the DFT blocks via resources in a DUTs-ATE Interface 72. The Interface 72, by way of example and not limitation, can be a probe card or a loadboard (not depicted). A group of Control Channels 74 are the channels used not only for providing control signals to couple the DUT-ATE Interface 72 to the DFT blocks in the DUTs 64, but also for routing the events from the DUTs 64 to the Distributing Processing Kernel 68. The communication between the elements of the H/W resources Pool 62 and the S/W processes Pool 66 to and from the DFT blocks is via a dedicated data channel or a shared channel as required.

Figure 4:
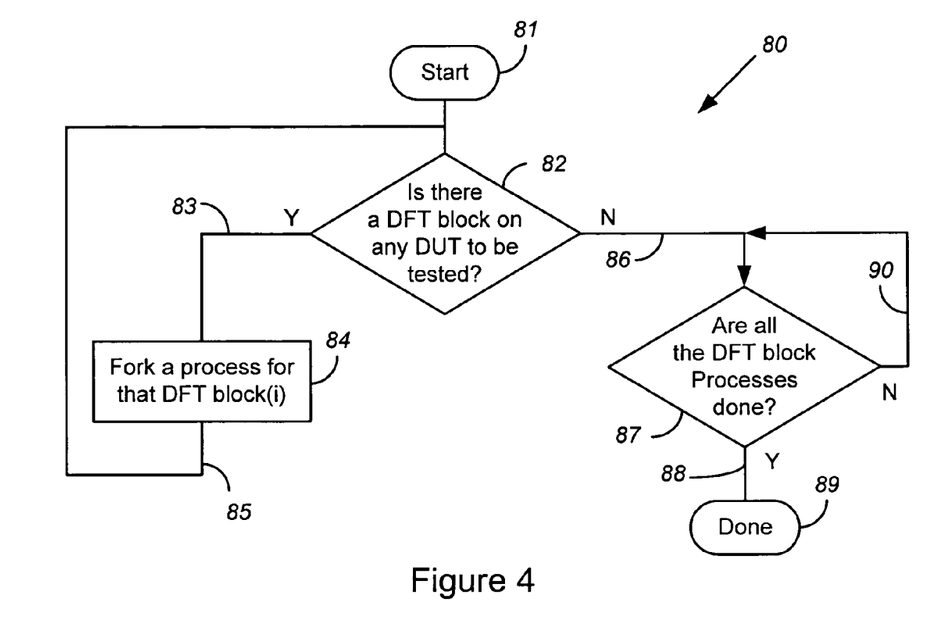
FIG. 4 is a generic test flowchart of a preferred embodiment of the present invention.

FIG. 4 shows a generic test flow diagram 80 of a preferred embodiment of the present invention. For a selected first DUT of the DUTs 64 (in FIG. 3) and one of the DFT blocks therein to be enabled for testing, the present invention begins at a Block 81 (marked as START) and moves to a decision Block 82 where it is determined if there is a DFT block that is to be operated for testing. If there is a DFT block to be enabled for testing, the present invention moves along path 83 (marked with a Y meaning Yes) to a Block 84. In the Block 84, a parallel Process (to be described subsequently) is forked for the testing of that block. In the Block 84, the DFT Block is also identified as DFT Block(i), where i represents a specific DFT Block that is associated with the forked Process. Accordingly, for the first selected DUT and the first selected DFT block therein is identified as DFT Block(1). In this description, as shown in FIG. 3, each of the DUTs 64 contains four (4) DFT Blocks and there is an unspecified total number of DUTs 64 so that i ranges from one to the total number of DFT Blocks contained in all the DUTs 64. After the Block 84, the present invention moves along a path 85 back to the decision Block 82 where the next DFT Block to be operated for testing is identified and a corresponding Process is evoked.

If all the DFT Blocks have been enabled for testing, the present invention then moves from the decision Block 82 along a path 86 to a decision Block 87. In the decision Block 87 it is determined if all the DFT Block processes (to be described in more detail subsequently) for completing the test processes enabled in that DFT Block have been done. If yes, the present invention moves along a path 88 (marked with a Y meaning Yes) to a Block 89 (marked DONE) where the present invention has completed its task of having all the DFT Blocks enabled for testing. If no, the present invention moves along a path 90 (marked N meaning No) and returns to the decision Block 87 where the present invention continues as previously described until all the DFT Block processes have been completed.

Figure 5:
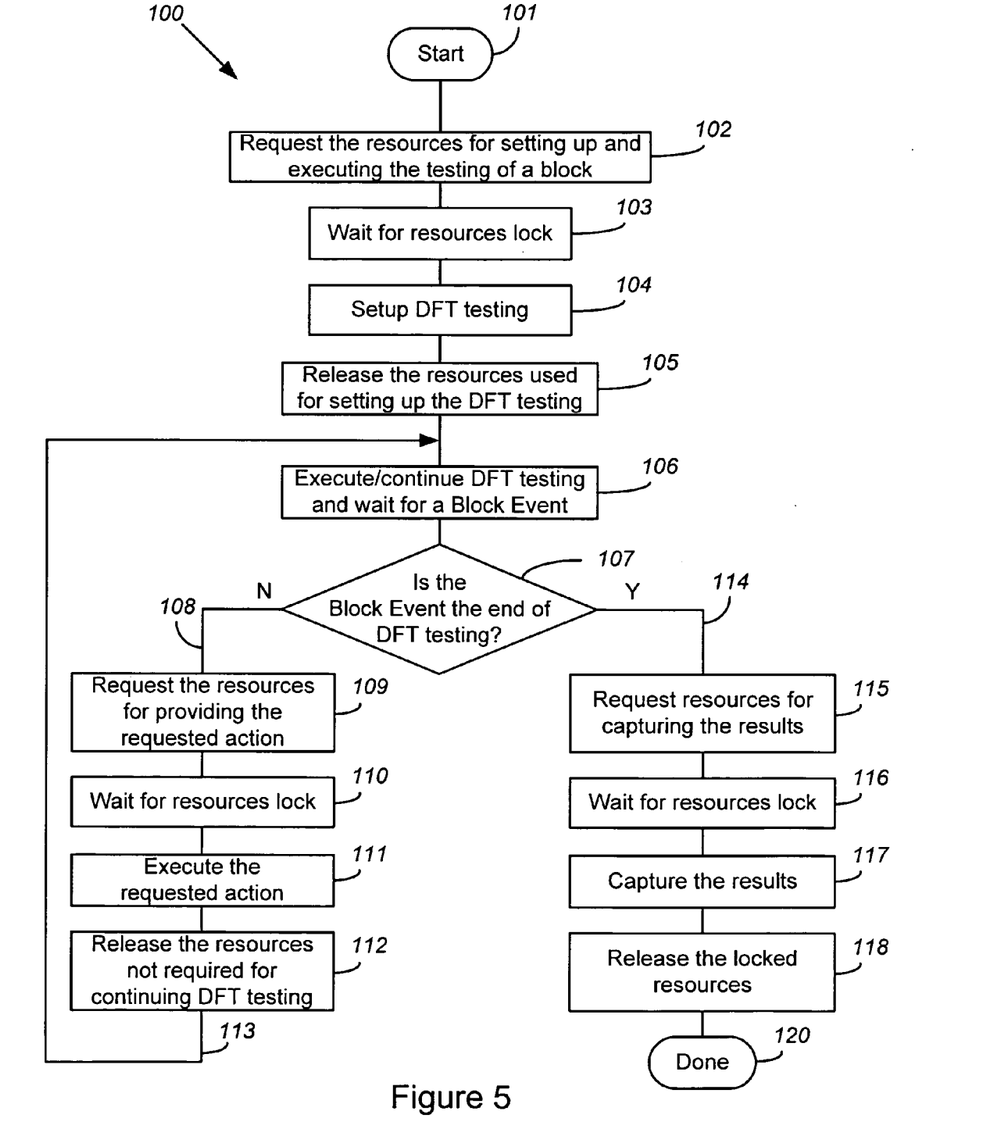
FIG. 5 depicts a flow diagram of a Process used in the embodiment shown in FIG. 4.

FIG. 5 depicts a flow diagram of a Process 100 described in connection with the Block 84 (in FIG. 4) where the Process is associated with a specific DFT Block(i). For this description and understanding of the operation of the present invention, the DFT Block(1) is the first DFT Block to be enabled for testing. It should be understood that all the activities and actions to be subsequently described in FIG. 5 is via the architecture described with respect to FIG. 3. The Process 100 begins at a Block 101 (marked as START) and moves to a Block 102. In Block 102, a request is made for the ATE hardware and software test processes in the H/W resources Pool 62 and the S/W processes Pool 66 (both depicted in FIG. 3) that are needed to set up and execute the testing of a block, which in this case is the DFT Block(1). The Process 100 then moves to a Block 103 where it waits for a Resources Lock to be placed on the requested ATE hardware and software test processes for the DFT Block(1) in accordance with the architecture described in FIG. 3. After the Resources Lock is made, the present invention moves to a Block 104 where the set up for having DFT Block(1) enabled for testing is arranged. Conventional ATE systems already exist which can perform this set up and no new invention or undue experimentation is required to perform this set up step. Thereafter, the Process 100 moves to a Block 105 where the resources that were locked for setting up the DFT Block(1) for testing are released while the locked resources needed for testing the DFT Block (1) remain locked. The Process 100 then moves to a Block 106 where the testing of the DFT Block(1) is enabled using the locked resources.

In the Block 106 the Process 100 also waits for a Block Event. It was previously described that the DUTs 64 are categorized as fully autonomous, semi-autonomous or non-autonomous. As a result, the DUT in each category has specific Block Events that may occur, such as but not limited to: testing done with success, testing done due to a failure and other activities that require the attention of the operator and/or the ATE testing system being coupled to the DFT Blocks. So upon the occurrence of the Block Event, the Process 100 moves to a decision Block 107 where it is determined if the Block Event is the End of DFT Testing of Block(1). If no, the Process 100 moves along a path 108 (marked N meaning No) to a Block 109. In Block 109, the Process 100 requests the resources (e.g., the ATE hardware and software test processes) needed for a Requested Action to handle the Block Event. The Process 100 then moves to a Block 110 where it waits for a Resources Lock to be placed on the requested resources. After the Resources Lock is made, the Process 100 moves to a Block 111 where the Requested Action is executed. After completion of the Requested Action, the Process 100 moves to a Block 112 where the locked resources not required for continuing the testing of the DFT Block(1) are released and made available for subsequent use.

The Process 100 then moves along a path 113 and returns to the Block 106 where it continues the testing of the DFT Block(1) and waits for the next Block Event. If the End of DFT Testing of the DFT Block(1) has occurred, then the Process 100 moves along a path 114 (marked Y meaning Yes) to a Block 115 where a request is made for the resources needed for capturing the Results (i.e., the data generated from having the DFT Block(1) operated for its testing processes). The Process 100 then moves to a Block 116 where it waits for a Resources Lock to be placed on the requested resources needed for capturing the Results. After the Resources Lock is made, the Process 100 moves to a Block 117 where the Results are captured. The Results are sent over the Data Channels 70 (in FIG. 3) and typically arranged to be displayed for viewing by an operator, sent to a recording device for subsequent review, or some other activity. After capturing the Results, the Process 100 moves to a Block 118 where all the locked resources are unlocked and made available for subsequent use. After the resources are unlocked, the Process 100 moves to a Block 120 (marked DONE) where it is stopped and has completed its task in connection with DFT Block(1).

With reference to FIGS. 3-5, it should be understood that after the Process 100 has moved from the Block 84 in connection with the DFT Block(1) and has returned to the decision Block 82, there is another DFT Block(2) as well as subsequent DFT Blocks(i) that need to be enabled for testing by the present invention. When the present invention moves to the Block 84 and forks a Process for handling the DFT Block (2), another Process 100 is invoked which proceeds as described for DFT Block(1). Similarly, the present invention will keep cycling through the decision Block 82 until a Process 100 is engaged and forked for each of the remaining DFT Block(i). However, for each DFT Block(i) after DFT Block (1), the required ATE hardware and software test processes in the H/W resources Pool 62 and the S/W processes Pool 66 may not be available because some or all of those resources may be locked for having DFT Block(1) to be enabled for testing and for capturing Results.

Accordingly, there will be a series of Processes 100 that will be started but each will be paused at the Block 103 if the required resources are not all available. If the testing processes to be enabled in each DFT Block(i) are not the same as one another or if there are multiple instances of required resources that are available, then it is possible that the resources for enabling one or more other DFT Block(i) are available even though the resources for enabling the DFT Block(1) are locked. For each of those other DFT Block(i) the associated Process 100 will continue until each arrives at a block where the needed resources are locked and not available.

Figure 6:
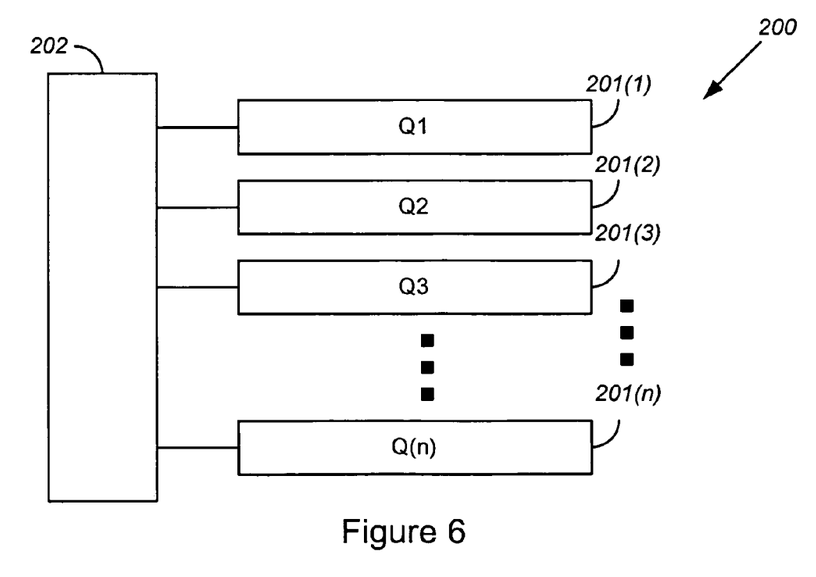
FIG. 6 shows a Resource Manager used in the embodiment depicted in FIG. 4.

FIG. 6 depicts a Resource Manager 200 where each of the Processes 100 that is paused because it is waiting for a Resources Lock is placed in a respective Queue 200(n), where n is the total number of queues needed for handling all the DFT Block(i) remaining after the DFT Block(1) is being enabled for testing. In the preferred embodiment of the present invention, when the needed resources that are being requested in connection with a specific DFT Block(i) are unlocked, the corresponding Process 100 will be removed from its respective Queue 200(n) and will be continued in the Block 103, 110 116 when such unlocked resources are reserved and locked for further activity. If there are several paused Process 100 waiting for the same unlocked resources, the Resources Manager 200 includes a selection routine in a Block 202 coupled to each Queue 200(n) for determining which of the paused Process 100 is to be removed from its respective Queue 200(n). In the preferred embodiment of the present invention, the selection routine in the Block 202 tracks when each Queue 200(n) is created if there are several paused Process 100 waiting for the same unlocked resources. The paused Process 100 are each handled in the time order that each respective Queue 200(n) is created with respect to one another. Of course, other possible selection routines are possible such as but not limited to a selection routine that places priority based on relative importance of specific DFT Blocks(i) to be enabled for testing before other DFT Blocks(i) are to be enabled.

As should be understood from the above as applied to the case where there is a combination of digital and analog test blocks, the present invention does not have to test each DFT block sequentially since the testing of each block depends upon the availability of the resources needed to each such block. Accordingly, the present invention can test various DFT blocks in parallel as hardware and software resources become available. The present invention avoids the problem in the prior art where the testing of analog test blocks would be conducted serially due limitation of resources and the testing of digital test blocks are paused. This results in maximum utilization of the resources, reduces the amount of duplicate resources and minimizes the idle time of each of the resources as long as the resources exist for conducting any of the testing of all the DFT blocks to be tested. If an amount of duplicate ATE hardware and ATE software test processes are desired, the associated increase cost for such arrange can be evaluated in view of the overall time that could be saved.

In the above described preferred embodiment of the present invention, all the test blocks of a specific DUT 64 are tested before the testing of a second DUT 64 is scheduled and conducted. An alternative second embodiment of the present invention is not limited to handling the DUTs 64 in a sequence. Since resources are provided for testing any of the DFT blocks of all the DUTs 64, the second embodiment of the present invention is arranged so that when specific resources are available, it determines which of the DFT blocks can be set up for testing even if the next DFT block to be tested is from another of the DUTs 64 different from the DFT block currently being enabled for testing. In other words, if each of the four DFT blocks on a specific DUT (of FIG. 3) require the same resources for testing one another and the current DFT block being enabled for testing is using a resource that would be needed for the testing any of the remaining DFT blocks on the same DUT, then this second embodiment will set up another DFT block of another DUT for testing enablement if other resources are available and not locked for the current DFT block being enabled for testing.

Although the present invention has been described in detail with reference to particular embodiments, persons possessing ordinary skill in the art to which this invention pertains will appreciate that various modifications and enhancements may be made without departing from the spirit and scope of the claims that follow.

What is claimed is:

1. A method for testing one or more devices under test (DUTs) when coupled to an automated test equipment (ATE) system, wherein each of the DUTs includes one or more testing blocks, the method comprising:
   receiving requests for resources at a distributed processing kernel of the ATE system, the requests for resources including requests for hardware resources and software resources needed to i) set up testing blocks associated with at least one of the DUTs, and ii) operate the testing blocks during test of the at least one of the DUTs;
   using the distributed processing kernel,
      for each of at least one of the requests, fulfilling the request by i) locking at least one of the resources for use by one of the testing blocks, and ii) allocating the at least one locked resource to the one of the testing blocks; and
      fulfilling at least one request for one or more resources needed to set up a particular one of the testing blocks, at a time when a request for one or more resources needed to operate the particular one of the testing blocks cannot be filled because at least one needed resource is locked for use by another testing block.

2. The method of claim 1, wherein the requests for resources are received for Designed for Test (DFT) testing blocks.

3. The method of claim 1, wherein the received requests for resources further comprise requests for hardware resources and software resources needed to capture results from the testing blocks, the method further comprising:
   using the distributed processing kernel,
      fulfilling at least one request for one or more resources needed to operate a given one of the testing blocks, at a time when a request for one or more resources needed to capture results from the given one of the testing blocks cannot be filled because at least one needed resource is locked for use by another testing block.

4. The method of claim 1, further comprising:
providing the allocated resources to the testing blocks using a DUT-ATE interface.

5. The method of claim 1, further comprising:
providing the allocated resources to the testing blocks using a probe card.

6. The method of claim 1, further comprising:
providing the allocated resources to the testing blocks using a load board.

7. The method of claim 1, further comprising:
receiving end of testing events at the distributed processing kernel, each end of testing event indicating that one or more resources locked to one of the testing blocks for set up or operation of the testing block can be unlocked.

8. An automated test equipment (ATE) system for testing one or more devices under test (DUTs) when coupled to the ATE system, wherein each of the DUTs includes one or more testing blocks, the ATE system comprising:
   a distributed processing kernel configured to receive requests for resources, the requests for resources including requests for hardware resources and software resources needed to i) set up testing blocks associated with at least one of the DUTs, and ii) operate the testing blocks during test of the at least one of the DUTs;
   wherein the distributed processing kernel is further configured to,
      for each of at least one of the requests, fulfill the request by i) locking at least one of the resources for use by one of the testing blocks, and ii) allocating the at least one locked resource to the one of the testing blocks; and fulfill at least one request for one or more resources needed to set up a particular one of the testing blocks, at a time when a request for one or more resources needed to operate the particular one of the testing blocks cannot be filled because at least one needed resource is locked for use by another testing block.

9. The ATE system of claim 8, wherein the distributed processing kernel is configured to receive requests for resources for Designed for Test (DFT) testing blocks.

10. The ATE system of claim 8, wherein:
the received requests for resources further comprise requests for hardware resources and software resources needed to capture results from the testing blocks; and
the distributed processing kernel is further configured to,
fulfill at least one request for one or more resources needed to operate a given one of the testing blocks, at a time when a request for one or more resources needed to capture results from the given one of the testing blocks cannot be filled because at least one needed resource is locked for use by another testing block.

11. The ATE system of claim 8, further comprising:
a DUT-ATE interface, wherein the distributed processing kernel is configured to provide the allocated resources to the testing blocks via the DUT-ATE interface.

12. The ATE system of claim 8, further comprising:
a probe card, wherein the distributed processing kernel is configured to provide the allocated resources to the testing blocks via the probe card.

13. The ATE system of claim 8, further comprising:
a load board, wherein the distributed processing kernel is configured to provide the allocated resources to the testing blocks via the load board.

14. The ATE system of claim 8, wherein the distributed processing kernel is configured to receive end of testing events, each end of testing event indicating that one or more resources locked to one of the testing blocks for set up or operation of the testing block can be unlocked.

* * * * *